(12) United States Patent
Moscone

(10) Patent No.: US 10,237,052 B1
(45) Date of Patent: Mar. 19, 2019

(54) MULTIPHASE CLOCK GENERATION AND INTERPOLATION WITH CLOCK EDGE SKEW CORRECTION

(71) Applicant: Cadence Design Systems, Inc., San Jose, CA (US)

(72) Inventor: Christopher George Moscone, Cary, NC (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 11 days.

(21) Appl. No.: 15/585,348

(22) Filed: May 3, 2017

(51) Int. Cl.
| | | |
|---|---|---|
| *H03B 5/32* | (2006.01) | |
| *H03K 3/03* | (2006.01) | |
| *H03L 7/08* | (2006.01) | |
| *H04L 7/00* | (2006.01) | |
| *H04L 25/03* | (2006.01) | |
| *H04L 7/033* | (2006.01) | |

(52) U.S. Cl.
CPC ............. *H04L 7/0025* (2013.01); *H03B 5/32* (2013.01); *H03K 3/0315* (2013.01); *H03L 7/0807* (2013.01); *H04L 7/0087* (2013.01); *H04L 7/033* (2013.01); *H04L 25/03057* (2013.01)

(58) Field of Classification Search
CPC ................. H04L 7/0025; H04L 7/0087; H04L 25/03057; H04L 7/033; H03K 3/0315; H03L 7/0807; H03B 5/32
See application file for complete search history.

(56) References Cited

U.S. PATENT DOCUMENTS

| | | | | |
|---|---|---|---|---|
| 5,180,994 A | * | 1/1993 | Martin | H03B 27/00 331/38 |
| 8,710,929 B1 | | 4/2014 | Naviasky et al. | |
| 2008/0136537 A1 | * | 6/2008 | Lakkis | B21C 37/26 331/38 |
| 2008/0252387 A1 | * | 10/2008 | Higashi | H03K 3/0322 331/57 |
| 2009/0163166 A1 | * | 6/2009 | Lin | H03L 7/07 455/260 |

* cited by examiner

*Primary Examiner* — Sam K Ahn
*Assistant Examiner* — Amneet Singh
(74) *Attorney, Agent, or Firm* — Hunton Andrews Kurth LLP

(57) ABSTRACT

Systems and methods disclosed herein provide for effectively eliminating the rotational and static phase skews between the in-phase (I) and quadrature (Q) clocks generated by phase interpolators in decision feedback equalizer based receivers. Embodiments of the systems and methods provide for (i) a ring oscillator that eliminates the rotational phase skews and (ii) a plurality of clock mixers that eliminate the static phase skews.

15 Claims, 6 Drawing Sheets

MULTIPHASE CLOCK GENERATION AND INTERPOLATION WITH CLOCK EDGE SKEW CORRECTION

TECHNICAL FIELD

The present application relates to systems and methods for eliminating rotational and static phase skews between the in-phase (I) and quadrature (Q) clocks generated by phase interpolators in serial receiver systems.

BACKGROUND

In various digital systems, signals can be transmitted from a transmitter to a receiver via a transmission channel. The transmission channel may be any suitable wired (or wireless) medium which links the transmitter to the receiver. However, in many instances (e.g., high data transmission speeds), the transmission channel becomes lossy. The transmission losses can be a result of, among other things, interference, attenuation, and delay in the channel. Further, such losses can also have considerable detrimental effect on the transmitted signal by the time it reaches the receiver. For example, sufficient amplitude and phase distortion of the transmitted signal may result in intersymbol interference (ISI) in the signal received at the receiver. ISI generally refers to the 'smearing' of a pulse or other symbol representing the logic state of one data bit to the degree such that it contributes to the content of one or more of the preceding (i.e., pre-cursor ISI) or succeeding (i.e., post-cursor ISI) data bits.

To guard against such detrimental effects, many serial receiver systems may perform at least one of decision feedback equalization (DFE) or continuous time linear equalization (CTLE) on the received data. Such serial receiver systems may include (i) an analog front end that provides some CTLE, (ii) a sampler, a (iii) DFE that uses the quantized receive data to adaptively feedback a correction signal, and (iv) a timing recovery unit. The timing recovery unit may use edge samples of the signal to determine if the received timing is early or late (i.e., phase detection). This information may go to a digital loop filter, which outputs to a phase interpolator in order to generate a recovered clock. The recovered clock includes an in-phase (I) and quadrature (Q) component. The I and Q clocks are expected to be perfectly in quadrature (i.e., the clocks are offset from each other by ninety degrees). The I and Q clocks are used to sample (i.e., with the sampler) the input signal and process the received data. Specifically, by lining the Q clock up with the edge of the received data bit, the I clock can be used to sample the center of the data bit. Further, in order to effectively sample the incoming data, the I clock should be at the same frequency as the incoming data. Generally, the frequency of the I clock and the incoming data is determined and provided by one or more crystal oscillators. If the I clock and the received data are associated with the same crystal oscillator, the frequencies for the I clock and the received data are likely also the same. However, in many instances, the crystal oscillators are different. In this case, even if the crystal oscillators are calibrated to the exact same frequency, for a myriad of reasons (e.g., mechanical differences in the respective crystals), the frequencies are not exactly the same but, rather, are almost synchronous (i.e., plesiochronous). For example, the crystal oscillators may be off by a couple hundred parts per million. In order to overcome this frequency offset, the phase interpolator gradually modifies the phase of the I and Q clocks so that they keep up with the frequency of the received data. For instance, if the crystal oscillator associated with the received data is running a little bit faster than the crystal oscillator associated with the I and Q clocks, the phase interpolator will advance the phase of the I and Q clocks to overcome the difference. Specifically, the phase interpolator gradually advances (i) the phase of the Q clock to align with the edge of the data bit and (ii) the phase of the I clock to align with the center of the data bit. Ideally, the quadrature relationship between the I and Q clocks should be maintained as the phase interpolator(s) strives to overcome the frequency offset. Unfortunately, due to certain non-linearity characteristics of the phase interpolator (e.g., integral non-linearity), the I and Q clocks don't perfectly align with each other. Specifically, because the phase interpolator interpolates an output clock (e.g., I or Q clock) between two inputs clocks, there are always some phase steps that are slightly different than others, and, as a result, the phase relationship between the I and Q clocks may vary. Accordingly, over time, as the phase interpolator attempts to align the Q clock to the edge of the data bit, the I clock may dither (e.g., jitter) around the center of the data bit. For example, instead of remaining at ninety (90) degrees (i.e., quadrature) from the edge of the data bit, the I clock can rotate between ninety-five (95) and eighty-five (85) degrees. This phenomenon is known as rotational IQ phase skew. Similarly, in other instances, the I clock may remain statically offset from the center of the data bit in either the negative or positive direction. For example, the I clock may remain fixed at eighty-five (85) degrees from the edge of the data bit. This phenomenon is known as static IQ phase skew. In either scenario (e.g., rotational and/or static IQ phase skew), the sampler will fail to sample the exact center of the data bit and, thus, the likelihood of bit error will increase.

Accordingly, there is a need to effectively eliminate the rotational and static IQ phase skews generated from the phase interpolation of the I and Q clocks.

DESCRIPTION OF EMBODIMENTS

Figure 1A:
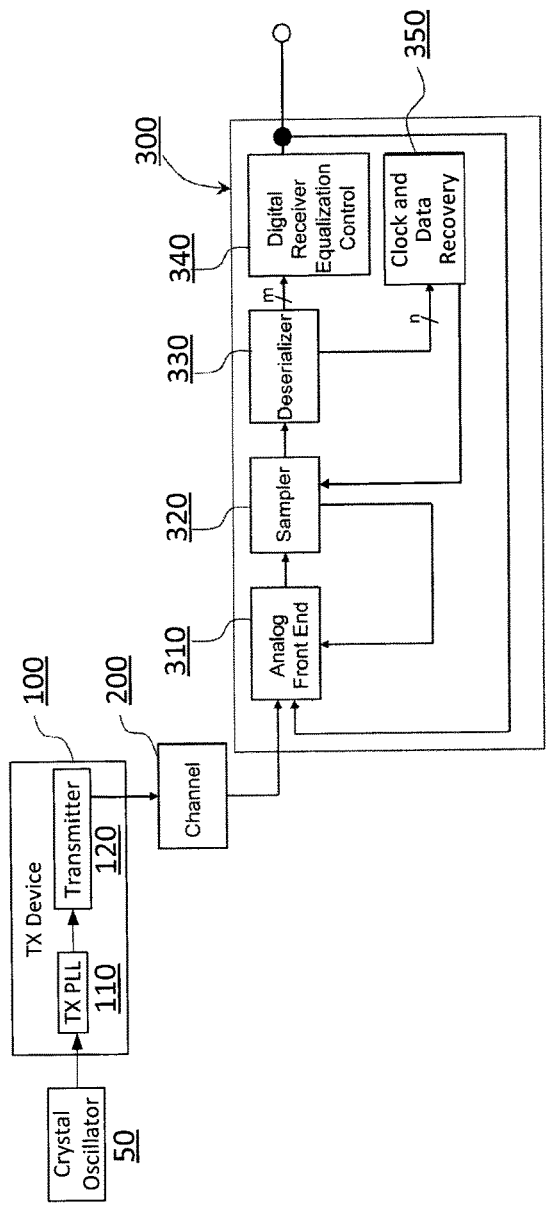
FIG. 1A illustrates a block diagram in accordance with an example embodiment of the present invention.

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide systems and methods for effectively eliminating the rotational and static IQ phase skews generated from the phase interpolation of the I and Q clocks. The systems and the methods herein address at least one of the problems discussed above.

According to an embodiment, a system for correcting phase skews for a plurality of phase-interpolated clocks includes a phase interpolator, wherein the phase interpolator is configured to generate the plurality of phase-interpolated clocks; and a ring oscillator, wherein the ring oscillator is configured to (i) receive at least one in-phase (I) clock and at least one ~I clock of the phase-interpolated clocks and (ii) generate a plurality of corrected clocks based on the plurality of received I clocks, wherein the at least one ~I clock is opposite in polarity to the at least one I clock.

According to an embodiment, a system for correcting phase skews for a plurality of phase-interpolated clocks includes a phase interpolator, wherein the phase interpolator is configured to generate the plurality of phase-interpolated clocks; and a plurality of clock mixers, wherein the plurality of clock mixers is configured to (i) receive the plurality of phase-interpolated clocks and (ii) generate a plurality of corrected clocks based on the received different clocks.

According to an embodiment, a method for correcting phase skews for a plurality of phase-interpolated clocks includes generating, with a phase interpolator, the plurality of phase-interpolated clocks; receiving, with a ring oscillator, at least one in-phase (I) clock and at least one ~I clock of the phase-interpolated clocks, wherein the at least one ~I clock is opposite in polarity to the at least one I clock; generating, with the ring oscillator, a plurality of corrected clocks based on the plurality of received I and ~I clocks, wherein the plurality of corrected clocks includes an I clock and a quadrature (Q) clock with a static phase relationship; receiving, with a plurality of clock mixers, the plurality of corrected clocks; and generating, with the plurality of clock mixers, a plurality of further corrected clocks based on the received corrected clocks, wherein the plurality of further corrected clocks includes an I clock and a Q clock that are out of phase from each other by 90°.

FIG. 1A illustrates a block diagram in accordance with an example embodiment of the present invention. As depicted in FIG. 1A, the block diagram includes a crystal oscillator 50, transmitter device 100, a channel 200, and a receiver 300. In an embodiment, the transmitter device 100 includes a phase-locked loop (TX PLL) 110 and a transmitter 120. In an embodiment, the TX PLL 110 generates data at a frequency determined by the crystal oscillator 50. Further, the transmitter 120 transmits the generated data over the channel 200. In an embodiment, the receiver 300 includes an analog front end 310, a sampler 320, a de-serializer 330, a digital receiver equalization control 340, and a clock and data recovery unit 350 (e.g., timing recovery unit). The receiver 300 receives the data from the transmitter 120. Specifically, the analog front end 310 of the receiver 300 receives the data transmitted via the channel 200. In an embodiment, the analog front end 310 may include a variable gain amplifier (VGA) and/or an analog linear equalization (e.g., CTLE). Further, as depicted in the figure, the analog front end 310 also receives outputs from the digital receiver equalization control 340 and the sampler 320. Specifically, the analog front end 310 sums the weighted and delayed outputs from the sampler 320 to the received signal. The weight values are determined by the digital receiver equalization control 340. In an embodiment, the sampler 320 samples and quantizes the received signal in order to generate in-phase (I) and quadrature (Q) samples over a series of predetermined unit intervals (UI), with each Q sample being disposed between consecutive I samples preferably offset from each by ½ UI. For example, the sampler 320 generates an I, Q, ~I, and ~Q data samples. In an embodiment, the ~I and ~Q data samples are opposite in polarity (i.e., offset by) 180° to the I and Q data samples, respectively. Further, the sampler 320 samples the received data based on a plurality of clock signals output from the clock and data recovery unit 350. In an embodiment, the sampler 320 sends the sampled data to (i) the analog front end 310 and (ii) the de-serializer 330. The de-serializer 330 de-serializes the quantized data and provides the de-serialized data to the digital receiver equalization controller 340 and the clock and data recovery unit 350. In an embodiment, the de-serializer 330 samples the quantized data at (i) the edge of the I sample and (ii) the center of the I sample. In an embodiment, the de-serialized data received by the digital receiver equalization controller 340 is de-serialized at a value different than the de-serialized data received by the clock and data recovery unit 350. For example, as depicted in the figure, (i) the digital receiver equalization controller 340 receives data that is de-serialized form bits and (ii) the clock and data recovery unit 350 receives data that is de-serialized for n bits. In an embodiment, the digital receiver equalization controller 340 runs at a slower clock rate than the clock and data recovery 350. Accordingly, the data provided to the digital receiver equalization controller 340 will be de-serialized for a greater number of bits (e.g., 16-20 bits) than the data provided to the clock and data recovery 350 (e.g., 4 bits). In an embodiment, the digital receiver equalization controller 340 carries out predetermined control processing for the equalization utilized by the receiver based on data received from the de-serializer 330, and feeds back various equalization information to the analog front end 310 to perform the corrective operation. For example, the digital receiver equalization controller 340 sends the DFE weights, the VGA gain, and the CTLE settings to the analog front end 310. As a feedback equalizer, the sampler 320 generally makes a logic 1-or-0 decision on the sampled data. The decision is scaled and delayed and then fed back to the analog front end 310, where it is added back into the received data. Therefore, the DFE establishes a feedback loop where the decision is made in that loop. A notable advantage of a DFE is that since a decision is made on the data—either a logic 1 or a logic 0—the DFE effectively provides for substantially noiseless operation (e.g., the DFE does not amplify existing noise by itself, as does a CTLE-only based approach). Accordingly, the ISI in the channel 200 may be addressed without introducing additional noise in the process. Further, in an embodiment, the clock and data recovery 350 receives the I and Q data samples from the de-serializer 330 and, based on the I and Q data, determines if the sampler 320 is running too slow or too fast. Then, in order to correct the late or early clock rate of the sampler 320, the clock and data recovery 350 generates a plurality of clocks to provide to the sampler 320.

Figure 1B:
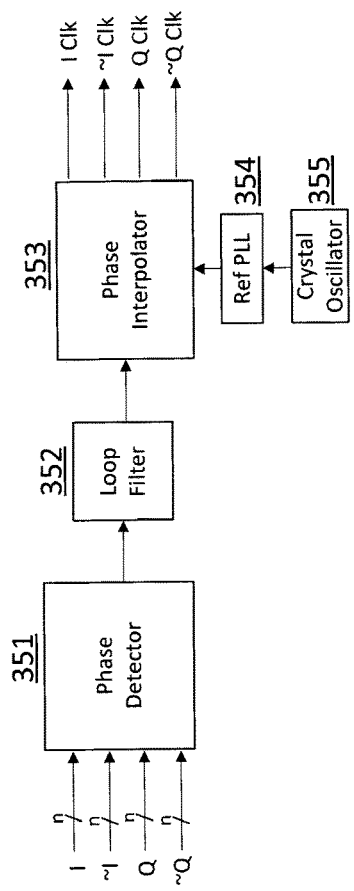
FIG. 1B illustrates a block diagram of the clock and data recovery utilized in FIG. 1A.

FIG. 1B illustrates a block diagram of the clock and data recovery utilized in FIG. 1A. As depicted in FIG. 1B, the clock and data recovery 350 includes a phase detector 351, a loop filter 352, a phase interpolator 353, a phase-locked loop (Ref PLL) 354, and a crystal oscillator 355. In an embodiment, the phase detector 351 receives a plurality of de-serialized data samples from the de-serializer 330. For example, as depicted in the figure, the de-serializer 330 transmits the de-serialized I, Q, ~I, and ~Q data samples to the phase detector 351. Based on the received data samples (i.e., I, Q, ~I, and ~Q), the phase detector 351 will generate one of an early, late, or no-update signal. In embodiment, the phase detector 351 performs this early/late analysis for each of the n de-serialized samples of the I, Q, ~I, and ~Q data samples. Accordingly, the phase detector 351 will provide n early/late signals to the loop filter 352 for processing. In an embodiment, the loop filter 352 determines if, over a certain period of time, the received early/late signals include a majority of early signals or a majority of late signals. Based on this determination, the loop filter 352 generates one of an early or late signal to transmit to the phase interpolator 353. In an embodiment, the loop filter 352 may simply add the early/late signals over the period of time and, based on the sign of the sum, generate one of an increment, decrement, or no-update signal. Further, the phase interpolator 353 modifies the phase of the plurality of clocks being provided to the sampler 320 based on the received early or late signal. For example, if the loop filter 352 transmits an early signal, the phase interpolator 353 decrements the phase of the plurality of clocks. In an embodiment, decrement implies that the phase of the sample clock is shifted earlier in time. Similarly, if the loop filter 352 transmits a late signal, the phase interpolator 353 increments the phase of the plurality of clocks. In an embodiment, increment implies that the phase of the sample clock is shifted later in time. Further, in an embodiment, as depicted in the figure, the plurality of clocks includes an I clock, a Q clock, an ~I clock, and a ~Q clock. In an embodiment, the I and ~I clocks correspond to the clock rates associated with the I and ~I data samples, respectively, and the Q and ~Q clocks correspond to the clock rates associated with the Q and ~Q data samples, respectively. Further, as depicted in the figure, the phase interpolator 353 generates and modifies each of the clocks (i.e., I, Q, ~I, and ~Q) in accordance with a frequency generated by the Ref PLL 354. In an embodiment, the Ref PLL 354 generates the frequency based on the crystal oscillator 355. In an embodiment, after modifying each of the clocks, the phase interpolator 353 then provides the modified clocks to the sampler 320.

Figure 2A:
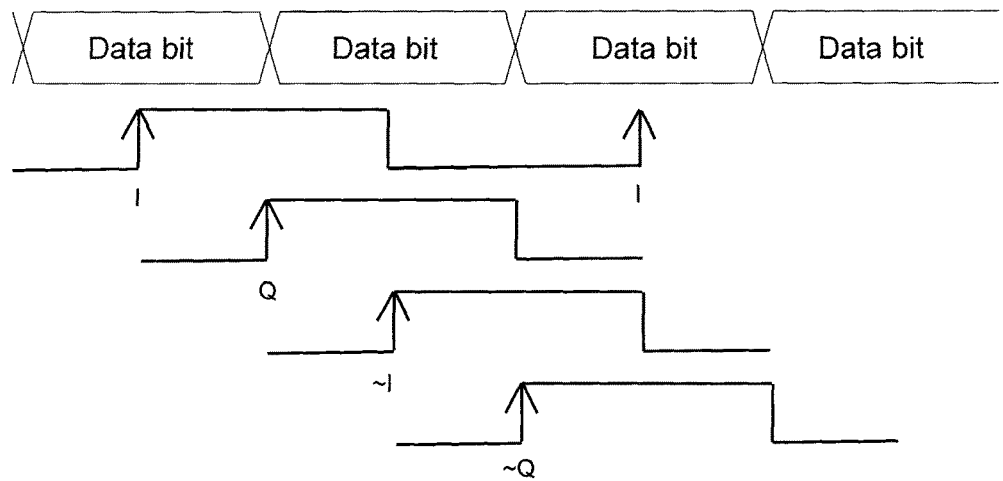
FIG. 2A illustrates sampling clocks in alignment with the received data.
Figure 2B:
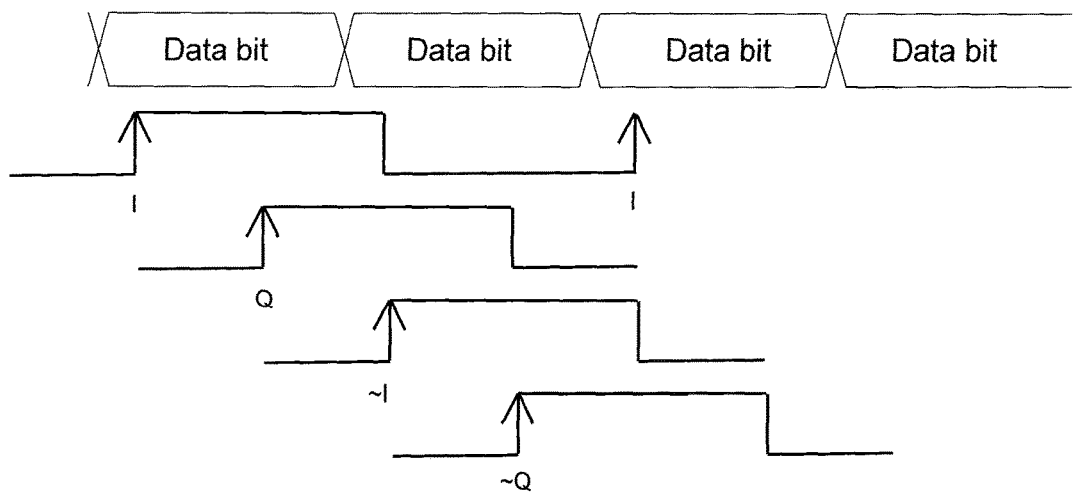
FIG. 2B illustrates the sampling clocks of FIG. 2A misaligned with the received data.

FIG. 2A illustrates sampling clocks in alignment with the received data. In an embodiment, the received data is plesiochronous with the sampling clocks (e.g., I, ~I, Q, and ~Q clocks). Further, as depicted in FIG. 2A, the I and ~I clocks are aligned with the center of the first and second data bits, respectively, of the received data. Similarly, the Q and ~Q clocks are aligned with the edge of the first and second data bits, respectively. Therefore, the sampler may effectively sample the data bits of the received data. However, after a period of time, since the sampling clocks are slightly offset in frequency from the received data, the sampling clocks will begin to trail the received data and, therefore, the sampling clocks will no longer be aligned. FIG. 2B illustrates the sampling clocks of FIG. 2A misaligned with the received data. For example, as depicted in FIG. 2B, (i) the I and ~I clocks are no longer aligned with the center of the first and second data bits and (ii) the Q and ~Q clocks are no longer aligned with the edge of the first and second data bits. Therefore, unlike the sampling clocks in FIG. 2A, the sampling clocks in FIG. 2B will not be able to effectively sample the data bits of the received data. As discussed above, the sampling clocks are realigned with the help of the clock and data recovery unit 250. For example, after the phase detector 351 receives the sampling clocks and the incoming data, it compares the Q clocks (i.e., Q clock and ~Q clock) with the edges of the incoming data bits. Based on the comparison, the phase detector 351 is able to determine if the sampling clocks are lagging or leading in relation to the incoming data. The phase interpolator 353 then generates new I and Q clock phases that are in alignment with the center and edge of the data bits, respectively. Further, as these new I and Q clock phases become misaligned because of the frequency drift, the clock and data recovery unit 353 generates another set of I and Q clock phases in alignment with the incoming data. This phase rotation process happens continually, thereby maintaining alignment between the sampling clocks and the incoming data.

Figure 3A:
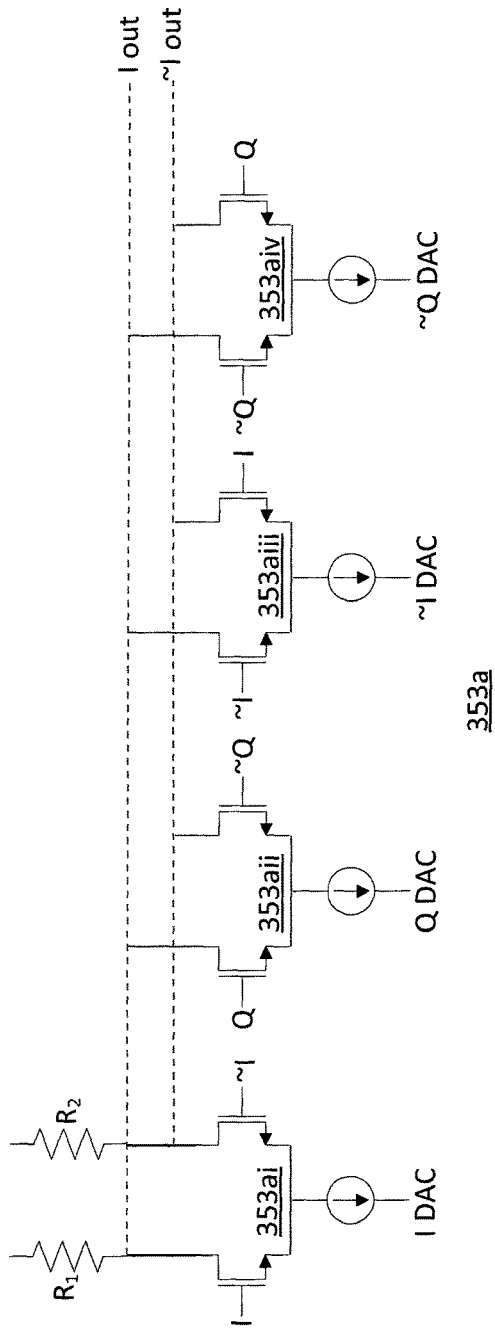
FIG. 3A illustrates a phase interpolator mixer operation for the I output clocks.

FIG. 3A illustrates a phase interpolator mixer operation for the I output clocks. As depicted in FIG. 3A, phase interpolator mixer 353a includes differential amplifiers 353ai to 353aiv and load resistors R1 and R2. In an embodiment, differential amplifier 353ai includes first and second n-channel metal-oxide-semiconductor (NMOS) transistors. As further depicted in the figure, the source nodes of the first and second NMOS transistors are connected to a digital-to-analog controller (DAC) for the I clock. Further, the drain nodes of the first and second NMOS transistors are connected to the resistors R1 and R2. In addition, the first NMOS transistor (e.g., left transistor) receives an I clock at its gate node and the second NMOS transistor (e.g., right transistor) receives an ~I clock at its gate node. In an embodiment, resistors R1 and R2 are of equal resistance. In an embodiment, differential amplifiers 353aii to 353aiv are similar in structure to differential amplifier 353ai. However, as depicted in the figure, (i) the first and second NMOS transistors receive different clocks at their respective gate nodes and (ii) the source nodes of the respective first and second NMOS transistors are connected to different DACs. For example, with regard to the differential amplifier 353aii, (i) the source nodes of the first and second NMOS transistors are connected to a DAC associated with the Q clock and (ii) the first NMOS transistor receives a Q clock at its gate node and the second NMOS transistor receives a ~Q clock at its gate node. Further, with regard to the differential amplifier 353aiii, (i) the source nodes of the first and second NMOS transistors are connected to a DAC associated with the ~I clock and (ii) the first NMOS transistor receives an ~I clock at its gate node and the second NMOS transistor receives an I clock at its gate node. Lastly, with regard to the differential amplifier 353aiii, (i) the source nodes of the first and second NMOS transistors are connected to a DAC associated with the ~Q clock and (ii) the first NMOS transistor receives a ~Q clock at its gate node and the second NMOS transistor receives a Q clock at its gate node. In an embodiment, the source node of the first NMOS transistor of the differential amplifier 353ai is connected to the source node of the first NMOS transistor of each of the differential amplifiers 353aii to 353aiv. Similarly, the source node of the second NMOS transistor of the differential amplifier 353*ai* is connected to the source node of the second NMOS transistor of each of differential amplifiers 353*aii* to 353*aiv*. In an embodiment, the I and ~I output clocks are interpolated between the input clocks received at the first and second NMOS transistors of each of the differential amplifier 353*ai* to 353*aiv*. Specifically, the mixer 353*a* generates the output clocks based on the currents at the I, ~I, Q, and ~Q DACs. Accordingly, the output clocks can be positioned anywhere within a 2-data bit interval. Further, only two adjacent differential amplifiers are ever on at once: (i) differential amplifiers 353*ai* and 353*aii* or (ii) differential amplifiers 353*aii* and 353*aiii* or (iii) differential pairs 353*aiii* and 353*aiv* or (iv) differential amplifiers 353*aiv* and 353*ai*. Therefore, because the input clocks between differential amplifiers are in quadrature, the output clocks will also be in quadrature. For example, if the I DAC current (i.e., differential amplifier 353*ai*) is nonzero but the Q DAC current (i.e., differential amplifier 353*aii*) is zero, then the I output clock will be aligned with the I input clock. Similarly, if the I DAC current is zero but the Q DAC current is nonzero, then the I output clock will be aligned with the Q input clock. However, if (i) the I DAC current is equal to the Q DAC current, then the I output clock will be phase-aligned half-way between the I and Q input clocks. In other words, as the I DAC current is gradually decreased and the Q DAC current is gradually increased, that phase of the I output clock moves from being aligned with the I input clock towards being aligned with the Q input clock. In this manner, the phase interpolator generates a new "interpolated" output clock. Further, as mentioned previously above, the ~I output clock will include the same phase as the I output clock but will be of opposite polarity. In an embodiment, the DACs are controlled by the clock and data recovery filter (e.g., loop filter 352).

Figure 3B:
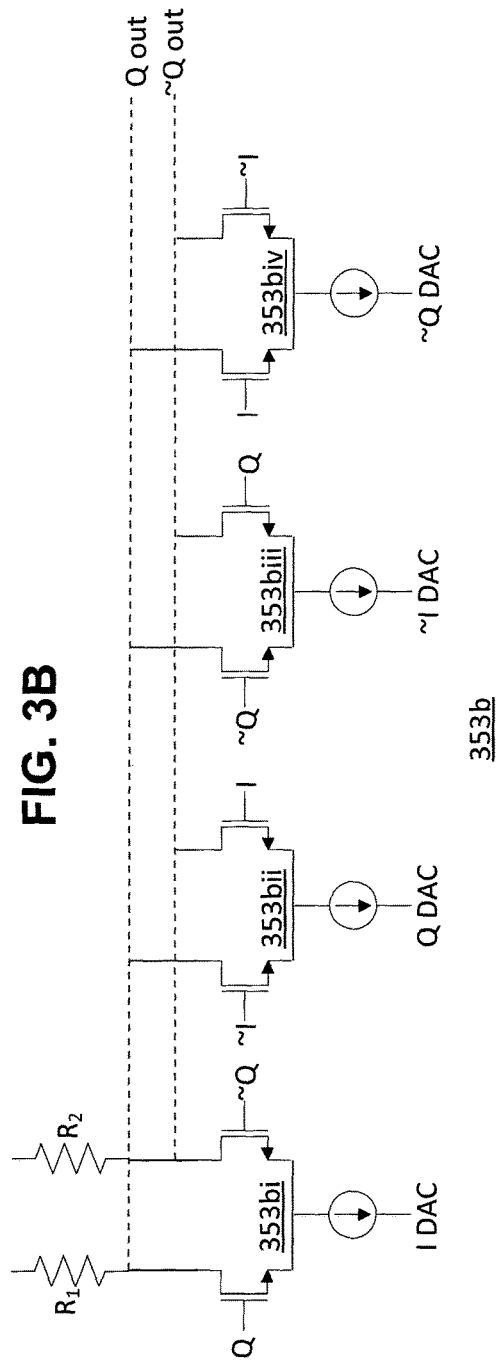
FIG. 3B illustrates a phase interpolator mixer operation for the Q output clocks.

FIG. 3B illustrates a phase interpolator mixer operation for the Q output clocks. In an embodiment, the phase interpolator mixer 353*b* is similar in structure to the phase interpolator mixer 353*a* except that the differential amplifiers 353*bi* to 353*biv* receive different input clocks. For example, with regard to the differential amplifier 353*bi*, the first NMOS transistor receives a Q clock at its gate node and the second NMOS transistor receives a ~Q clock at its gate node. Further, with regard to the differential amplifier 353*bii*, the first NMOS transistor receives an ~I clock at its gate node and the second NMOS transistor receives an I clock at its gate node. Further, with regard to the differential amplifier 353*biii*, the first NMOS transistor receives a ~Q clock at its gate node and the second NMOS transistor receives a Q clock at its gate node. Lastly, with regard to the differential amplifier 353*biv*, the first NMOS transistor receives an I clock at its gate node and the second NMOS transistor receives an ~I clock at its gate node.

Offsets between the phase interpolator mixers 353*a* and 353*b* can lead to static IQ phase skews. Further, as the mixers 353*a* and 353*b* rotate their phase clocks, rotational IQ phase skew can also observed. Specifically, the rotational IQ phase skew is caused by the mixing (e.g., between the differential amplifiers) of non-sinusoidal waveforms as well as the inherent nonlinearities found in each of the mixers 353*a* and 353*b* and the corresponding DACs.

Figure 4A:
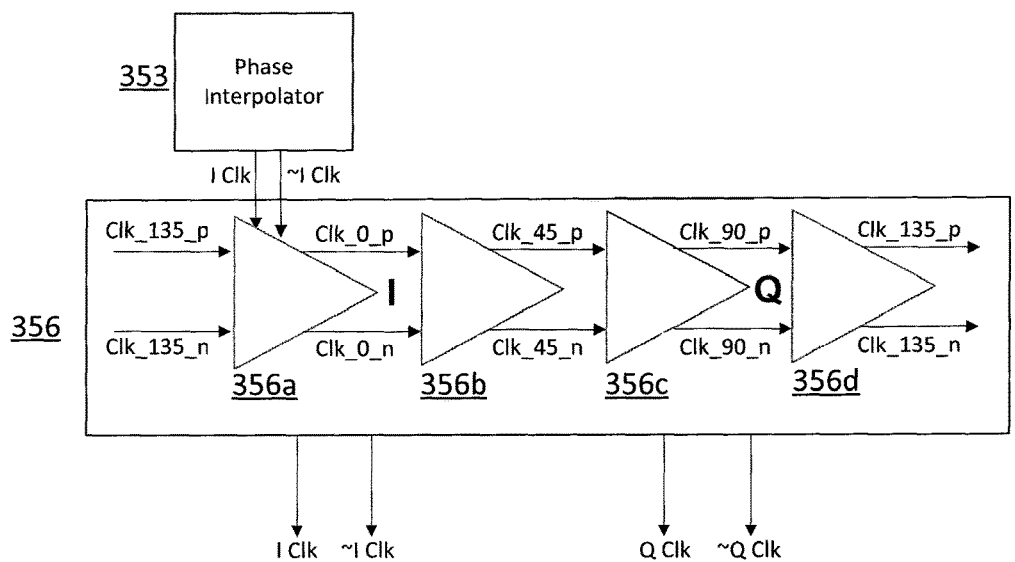
FIG. 4A illustrates a rotational IQ phase skew correction for the phase interpolator in accordance with an example embodiment of the present invention.

FIG. 4A illustrates a rotational IQ phase skew correction for the phase interpolator in accordance with an example embodiment of the present invention. As depicted in FIG. 4A, rotational IQ phase skew correction unit 356 (*i*) receives the I and ~I clocks from the phase interpolator 353 and (ii) generates corrected I, ~I, Q, and ~Q clocks. In an embodiment, the corrected clocks can then be provided to sampler 320 of FIG. 1A. In an embodiment, the rotational IQ phase skew correction unit 356 is an injection-locked ring oscillator including a plurality of delay stages. The ring oscillator generates a characteristic oscillator signal. The ring oscillator includes a first delay stage 356*a*, a second delay stage 356*b*, a third delay stage 356*c*, and a fourth delay stage 356*d*. In an embodiment, each delay stage contributes a finite delay, such that a time-delayed, or phase offset, version of the oscillator signal is established after each delay stage. In an embodiment, each of the delay stages is of identical structure and configuration. Therefore, each delay stage applies the same finite delay. The number of delay stages determines the amount of phase shift of each stage. The oscillator signal undergoes a half cycle (0°-180°) total phase shift as it effectively 'travels' through the intervening delay stages in the first half of the injection-locked ring loop (e.g., clock signals Clk_0_p, Clk_45_p, Clk_90_p, Clk_135_p). Similarly, the oscillator signal undergoes the remaining half cycle of phase shift (180°-360°) as it effectively 'travels' the other half of the injection-locked ring loop (e.g., clock signals Clk_0_n, Clk_45_n, Clk_90_n, Clk_135_n). Thus, each half cycle is divided by n stage-to-stage phase shifts, or by a phase shift of 180°/n. Therefore, because four delay stages are employed, each delay stage would contribute a predetermined phase difference of 180°/4 or 45°. In an embodiment, as depicted in FIG. 4A, the I and ~I clocks of the phase interpolator 353 are injected into the first delay stage 356*a*. The injection of the I and ~I clocks causes the generated oscillator signal of the injection-locked loop to lock in both frequency and phase with the I and ~I clocks. Injection locking generally occurs when an oscillator operating at a certain frequency (e.g., the injection-locked ring oscillator) is disturbed by a second oscillator operating at a different but very close frequency (e.g., the I and ~I clocks) such that the coupling effects yield a locking of the first oscillator to the second oscillator. If the frequencies are sufficiently close and the coupling sufficiently strong, such injection locking will consistently occur in much the same manner that the vibrating strings of two instruments will eventually synchronize in vibration frequency if they are similarly tuned and drawn close enough together. In an embodiment, because the I and ~I clocks were injected at the first delay-stage 356*a*, the injection locked version of the oscillator signal resulting at the delay stage would be in-phase with the I and ~I clocks (i.e., the periodic injection signal). Accordingly, after the first delay stage 356*a*, the oscillator signal at the first half of the loop (i.e., Clk_0_p) and the other half of the loop (i.e., Clk_0_n) is not delayed with respect to injected I and ~I clocks. Further, the injection-locked versions of the oscillator signal after the other delay stages would be accordingly referenced in phase to the first delay stage 356*a*. For example, after the second delay stage 356*b*, the oscillator signal at the first half of the loop (i.e., Clk_45_p) and the other half of the loop (i.e., Clk_45_n) is delayed by 45°. Similarly, after the third and fourth delay stages 356*c* and 356*d*, the oscillator signal is delayed by 90° and 135°, respectively. In an embodiment, as depicted in FIG. 4A, the I and ~I clocks can be provided as clocks signals Clk_0_p and Clk_0_n, respectively, and the Q and ~Q clocks can be provided as clock signals Clk_90_p and Clk_90_n, respectively. Further, unlike the phase interpolator 353*a*, the I clocks and the Q clocks in the injection locked ring don't move in relation to one another. Accordingly, the I clocks and Q clocks output from the rotational IQ phase skew correction unit 356 will have nearly zero rotational IQ phase skew.

Figure 4B:
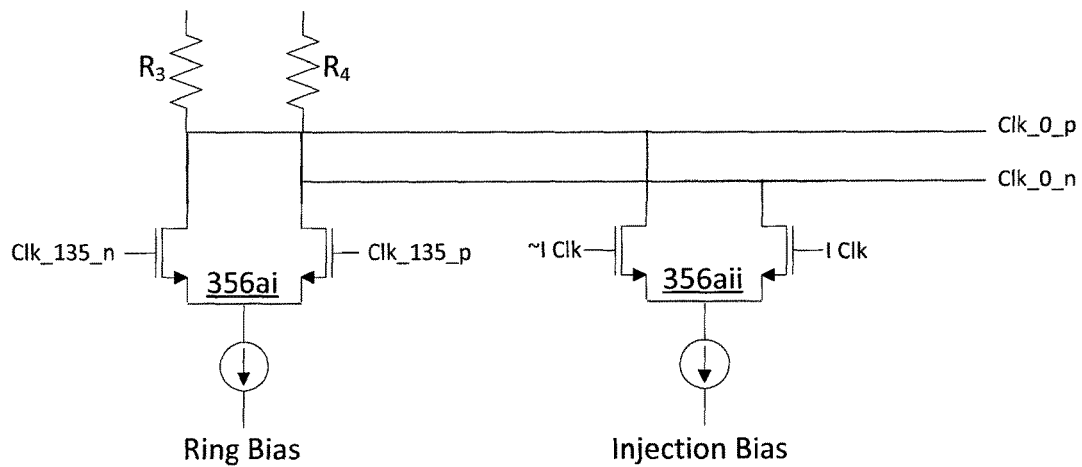
FIG. 4B illustrates an example embodiment of a delay stage utilized in the rotational IQ phase skew correction of FIG. 4A.

FIG. 4B illustrates an example embodiment of a delay stage utilized in the rotational IQ phase skew correction of FIG. 4A. Specifically, FIG. 4B depicts the first delay stage 356a. In an embodiment, the first delay stage 356a includes differential amplifiers 356ai and 356aii and load resistors R3 and R4. In an embodiment, resistors R3 and R4 are of equal resistance. In an embodiment, differential amplifier 356ai includes first and second NMOS transistors. As further depicted in the figure, the source nodes of the first and second NMOS transistors are connected to a bias current for the injection-locked ring oscillator. Further, the drain nodes of the first and second NMOS transistors are connected to the resistors R3 and R4. In addition, the first NMOS transistor (e.g., left transistor) receives clock signal Clk_135_n at its gate node and the second NMOS transistor (e.g., right transistor) receives clock signal Clk_135_p at its gate node. In an embodiment, with regard to the differential amplifier 353aii, (i) the source nodes of the first and second NMOS transistors are connected to an injection bias current and (ii) the first NMOS transistor receives a ~I clock at its gate node and the second NMOS transistor receives a I clock at its gate node, wherein the I and ~I clocks are provided by the phase interpolator 353a. Further, in an embodiment, (i) the source node of the first NMOS transistor of the differential amplifier, 356ai is connected to the source node of the first NMOS transistor of the differential amplifier 356aii and (ii) the source node of the second NMOS transistor of the differential amplifier 356ai is connected to the source node of the second NMOS transistor of the differential amplifiers 356aii. In an embodiment, the first delay stage 356a is able to lock the clock signals Clk_0_p and Clk_0_n to the injection clocks (i.e., the I and ~I clocks) based on the ring and injection bias currents. The ring oscillator's bias current is typically calibrated along with the value of the load resistors (i.e., R3 and R4) through a digital calibration loop at startup, so as to force the ring oscillator to have a natural oscillation frequency which is as close to the injection frequency as possible. This places the ring oscillator, when injection-locked, within the center of its lock range. If the injection clock frequency is increased (or decreased) beyond a certain value, above or below this calibrated natural ring oscillation frequency, then the loop will lose lock since the ring oscillator is trying to naturally oscillate at a point which is too far away from the driving injection frequency. The ring's natural oscillation frequency depends on the load resistance and capacitance at the output of each stage. Further, the ring oscillator's voltage swing and loop gain depends partly on the bias current and load resistor values. The injection bias current is typically some fraction of the calibrated ring oscillator bias, having sufficient strength to allow the injection differential pair (e.g., 356ai) to "pull" the ring oscillator stage into phase alignment with the injection clocks (i.e., the I and ~I clocks). The injection bias must be strong enough to allow the injection clock to lock the ring oscillator (stronger injection biases help maximize the lock range). For example, the ring bias may range anywhere from several hundred microamps (e.g., for a 500 MHz natural frequency) to several milliamps (e.g., for a 5 GHz to 10 GHz natural frequency). Further, a typical value for the injection bias would be one-quarter of the respective ring bias. In an embodiment, the other delay stages 356b to 356d include circuit structures essentially identical to the delay stage 356a. However, the other delay stages do not receive the same injection clocks as the delay stage 356a. Instead, the injection differential pairs in the other delay stages are typically dummy devices. Further, the injection bias currents in the other delay stages may also be zero.

Figure 4C:
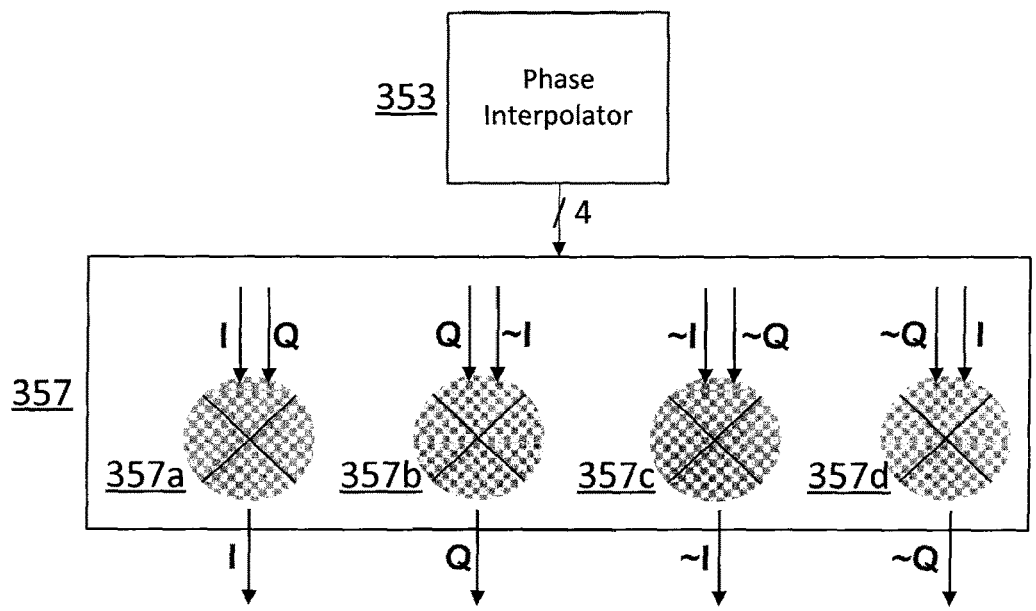
FIG. 4C illustrates a static IQ phase skew correction for the phase interpolator in accordance with an example embodiment of the present invention.

FIG. 4C illustrates a static IQ phase skew correction for the phase interpolator in accordance with an example embodiment of the present invention. As depicted in the figure, static IQ phase skew correction unit 357 (i) receives the I, Q, and ~Q clocks from the phase interpolator 353 and (ii) generates corrected I, ~I, Q, and ~Q clocks. In an embodiment, the static IQ phase skew correction unit 357 includes clock mixers 357a to 357b. In an embodiment, the clock mixer 357a receives the I and Q clocks from the phase interpolator 353 and generates a corrected I clock. Similarly, the clock mixer 357b receives the Q and ~I clocks from the phase interpolator 353 and generates a corrected Q clock. Further, the clock mixer 357c receives the ~I and ~Q clocks from the phase interpolator 353 and generates a corrected ~I clock. Further, the clock mixer 357d receives the ~Q and I clocks from the phase interpolator 353 and generates a corrected ~Q clock.

Figure 4D:
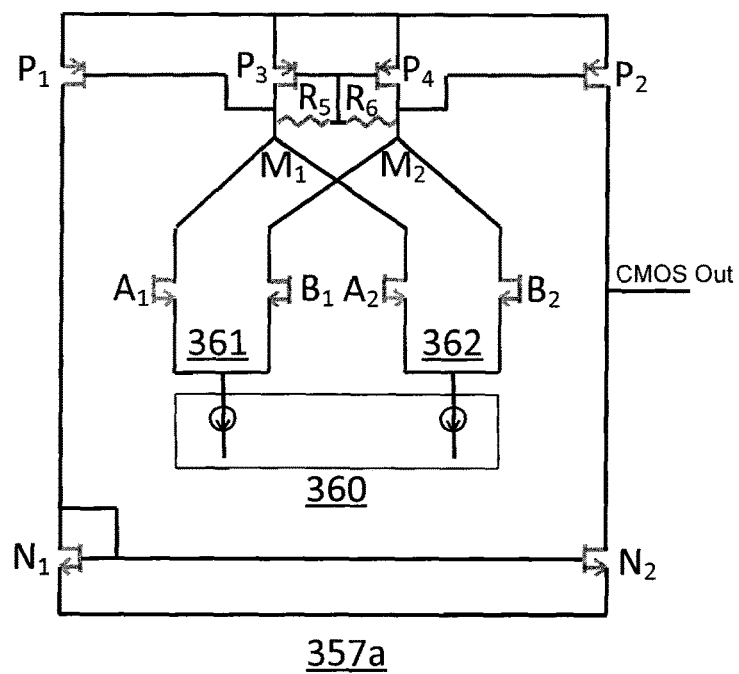
FIG. 4D illustrates an example embodiment of a clock mixer utilized in the static IQ phase skew correction of FIG. 4C.

FIG. 4D illustrates an example embodiment of a clock mixer utilized in the static IQ phase skew correction of FIG. 4C. As depicted in the figure, the clock mixer 357a includes a DAC 360, differential pairs 361 and 362, load resistors R5 and R6, p-channel metal-oxide-semiconductor (PMOS) transistors P1, P2, P3, and P4, NMOS transistors N1 and N2, and a complementary metal-oxide-semiconductor (CMOS) output CMOS Out. In an embodiment, resistors R5 and R6 are of equal resistance. In an embodiment, the differential pair 361 includes a first NMOS transistor A1 and a second NMOS transistor B1. Further, the source nodes of the transistors A1 and B1 are connected to the DAC 360. Similarly, the differential pair 362 includes a first NMOS transistor A2 and a second NMOS transistor B2, and the source nodes of the transistors A2 and B2 are also connected to the DAC 360. Further, (i) the drain nodes of the transistors A1 and A2 are connected to each other via a mixing node M1 and (i) the drain nodes of the transistors B1 and B2 are connected to each other via a mixing node M2. In addition, the mixing node M1 is also connected to (i) the resistor R5, (ii) the drain node of the transistor P3, and (iii) the gate node of the transistor P1. Similarly, the mixing node M2 is connected to (i) the resistor R6, the drain node of the transistor P4, and the (iii) the gate node of the transistor P2. Further, the resistors R5 and R6, as well as the gate nodes of the transistors P3 and P4, are connected together. In an embodiment, transistors P3 and P4 are active loads. Further, the transistors P3 and P4 are biased by the resistors R5 and R6, respectively, thereby providing some gain. Further, the source nodes of each of the transistors P1 to P4 are connected to each other. Further, the source node of the transistor P1 is connected to the drain node of the transistor N1. In addition, the drain node of the N1 transistor is also connected to the gate nodes of the N1 and N2 transistors. Further, the source node of the N1 transistor is connected to the source node of the N2 transistor. Further, the drain nodes of the P2 and N2 transistors are each connected to the output CMOS Out.

In an embodiment, the clock mixer 357a mixes the I and Q clocks together to generate an I clock that is somewhere in between the two clocks. The I clock is input into the differential amplifier 361 and the Q clock is input into the differential amplifier 362. Specifically, as regards to the I clock, clock signal Clk_0_p is input into the gate node of the transistor A1 and clock signal Clk_0_n is input into the gate node of the transistor B1. Further, with regard to the Q clock, the clock signal Clk_90_p is input into the gate node of the transistor A2 and the clock signal Clk_90_n is input into the transistor B2.

In an embodiment, the clock mixer 357b mixes the Q and ~I clocks together to generate a Q clock that is somewhere in between the two clocks. Therefore, using the structure of the clock mixer 357a, the Q clock is input into the differential amplifier 361 and the ~I clock is input into the differential amplifier 362. Specifically, as regards to the Q clock, clock signal Clk_90_p is input into the gate node of the transistor A1 and clock signal Clk_90_n is input into the gate node of the transistor B1. Further, with regard to the Q clock, the clock signal Clk_0_n is input into the gate node of the transistor A2 and the clock signal Clk_0_p is input into the transistor B2.

In an embodiment, the clock mixer 357c mixes the ~I and ~Q clocks together to generate an ~I clock that is somewhere in between the two clocks. Therefore, using the structure of the clock mixer 357a, the ~I clock is input into the differential amplifier 361 and the ~Q clock is input into the differential amplifier 362. Specifically, as regards to the ~I clock, clock signal Clk_0_n is input into the gate node of the transistor A1 and clock signal Clk_0_p is input into the gate node of the transistor B1. Further, with regard to the ~Q clock, the clock signal Clk_90_n is input into the gate node of the transistor A2 and the clock signal Clk_90_p is input into the transistor B2.

In an embodiment, the clock mixer 357d mixes the ~Q and I clocks together to generate a ~Q clock that is somewhere in between the two clocks. Therefore, using the structure of the clock mixer 357a, the ~Q clock is input into the differential amplifier 361 and the I clock is input into the differential amplifier 362. Specifically, as regards to the ~Q clock, clock signal Clk_90_n is input into the gate node of the transistor A1 and clock signal Clk_90_p is input into the gate node of the transistor B1. Further, with regard to the I clock, the clock signal Clk_0_p is input into the gate node of the transistor A2 and the clock signal Clk_0_n is input into the transistor B2.

In an embodiment, the clocks at the differential amplifiers 361 and 362 are mixed together at the mixing nodes M1 and M2. The DAC 360 controls the degree of mixing and, therefore, the phase of the output clock CMOS out. For example, if DAC 360 provides all the current to the clock at differential amplifier 361, then the output clock CMOS out will be in phase with that clock. However, as more current is introduced into the differential amplifier 362, the phase of the output clock will move gradually towards the other clock. Therefore, the output clock can be in line with incoming clock at the differential amplifier 361, the incoming clock at the differential amplifier 362, or somewhere in between. In an embodiment, the static IQ phase skew in the incoming clocks can be corrected by dynamically monitoring and modifying the output clocks with the plurality of DACs 360. For example, static IQ phase skew in the incoming clocks can be corrected with equivalent time sampling. In equivalent time sampling, a free-running clock samples the output I, Q, ~I, and ~Q clocks over a certain period of time. In an embodiment, the free-running clock is a single, lower-frequency, asynchronous clock. Further, after sampling the output I, Q, ~I, and ~Q clocks over the period of time, a digital block (e.g., low-speed) averages the samples for each of the output I, Q, ~I, and ~Q clocks. Accordingly, based on the determined averages, the digital block can determine the static IQ phase skew of each clock with respect to an adjacent clock. For example, it can be determined that, after a period of time, the I clock is too close to the Q clock or, similarly, that the ~I clock is too close to the ~Q clock. The digital block provides this information to the DACs 360, which then corrects each of the output clocks. In an embodiment, the digital block may be implemented in a processor connected to the receiver 300. In an embodiment, the static IQ phase skew of each quadrature pair (e.g., I and Q, Q and ~I, ~I and ~Q, ~Q and ~I) is corrected simultaneously. For example, the Q clock is corrected relative to the I clock, the ~I clock is corrected relative to the Q clock, the ~Q clock is corrected relative to the ~I clock, the I clock is corrected relative to the ~Q clock, etc. Further, in an embodiment, in order to provide flexibility in the direction of the correction (i.e., positive or negative), the differential pairs 361 and 362 of each of the clock mixers 357a to 357d are initially biased with the same current. Therefore, the output clocks of each of the clock mixers 357a to 357d will initially be halfway between the clock associated with the differential amplifier 361 (e.g., I clock) and the clock associated with the differential amplifier 362 (e.g., Q clock). Accordingly, depending on the determined static IQ phase skews, the DACs 360 can adjust the output clocks in the positive or negative direction. On the other hand, if only one of the differential amplifiers was biased, then the DAC 360 would only be able to correct the static IQ phase skews in one direction.

Further, in an embodiment, the clock mixers 357a to 357d can also convert common mode logic signals (CML) to a CMOS signal. Specifically, after the clocks are mixed at the mixing nodes M1 and M2, the signals no longer look like rail-to-rail CMOS signals but, rather, CML signals. In an embodiment, the transistors P1, P2, N1, and N2 convert the mixed signals back to CMOS. Further, by converting the signals from CML to CMOS, the mixing of the signals becomes more linear. In another embodiment, the clock mixers 357a to 357d can also be driven with the CML signals. Either way, the output of the clock mixers 357 to 357d will always be a CMOS output clock. In an embodiment, the corrected I clocks and Q clocks output from the static IQ phase skew correction unit 357 can be provided to the sampler 320.

Figure 4E:
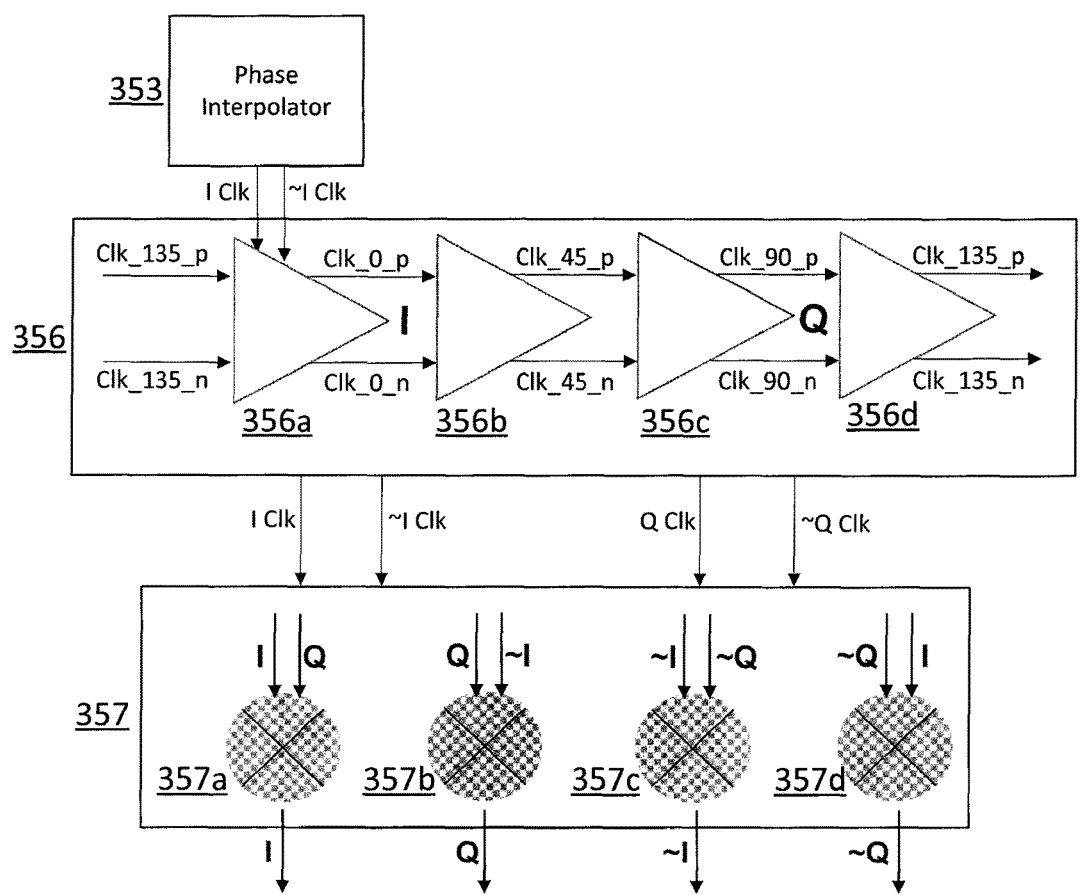
FIG. 4E illustrates a combined rotational and static IQ phase skew correction in accordance with an example embodiment of the present invention.

FIG. 4E illustrates a combined rotational and static IQ phase skew correction in accordance with an example embodiment of the present invention. Specifically, as depicted in FIG. 4E, the static IQ phase skew correction unit 357 (i) receives a first set of corrected output clocks (e.g., I, ~I, Q, and ~Q clocks) from the rotational IQ phase skew correction unit 356 and (ii) generates a second set of corrected output clocks (e.g., I, Q, ~I, and ~Q clocks). In an embodiment, the combination of the rotational IQ phase skew correction unit 356 and the static IQ phase skew correction unit 357 eliminates the rotational and static IQ phase skews between the I and Q clocks interpolated by the phase interpolator 353. In an embodiment, the second set of corrected output clocks can be provided to the sampler 320.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

The invention claimed is:

1. A system to correct phase skews for a plurality of phase-interpolated clocks, the system comprising:
   a phase interpolator, wherein the phase interpolator is configured to generate the plurality of phase-interpolated clocks;
   a ring oscillator, wherein the ring oscillator is configured to (i) receive at least one in-phase (I) clock and at least one ~I clock of the phase-interpolated clocks and (ii) generate a plurality of corrected clocks based on the received at least one I clock and at least one ~I clock, wherein the at least one ~I clock is opposite in polarity to the at least one I clock,
   wherein the plurality of corrected clocks includes (i) corrected I and ~I clocks and (ii) at least one quadrature (Q) clock and ~Q clock, wherein the at least one ~Q clock is opposite in polarity to the at least one Q clock, and
   a plurality of clock mixers, wherein (i) a first of the plurality of clock mixers receives the corrected I clock and the Q clock, and generates a further corrected I clock, (ii) a second of the plurality of clock mixers receives the Q clock and the corrected ~I clock, and generates a corrected Q clock, (iii) a third of the plurality of clock mixers receives the corrected ~I clock and the ~Q clock, and generates a further corrected ~I clock, and (iv) a fourth of the plurality of clock mixers receives the ~Q clock and the corrected I clock, and generates a corrected ~Q clock.

2. The system of claim 1, wherein the ring oscillator includes a plurality of delay stages, wherein each delay stage delays an oscillator signal of the ring oscillator by a respective amount.

3. The system of claim 2, wherein the ring oscillator includes four delay stages, wherein: (i) a first delay stage delays the oscillator signal by 0°, (ii) a second delay stage delays the oscillator signal by 45°, (iii) a third delay stage delays the oscillator signal by 90°, and (iv) a fourth delay stage delays the oscillator signal by 135°.

4. The system of claim 3, wherein the corrected I and ~I clocks are generated after the first delay stage and the Q and ~Q clocks are generated after the third delay stage, wherein a phase relationship between the I and the Q clocks is static.

5. The system of claim 4, wherein, at the first delay stage, an oscillator signal of the ring oscillator locks to a frequency of the received at least one I clock and at least one ~I clock.

6. The system of claim 1, wherein each clock mixer is controlled by at least one respective analog-to-digital controller (DAC), wherein the further corrected clock is generated based on a bias current provided to the at least one respective DAC.

7. The system of claim 1, wherein the corrected Q clock is 90° out of phase with the further corrected I clock.

8. The system of claim 6, wherein each of the plurality of clock mixers includes a plurality of differential amplifiers, wherein a first differential amplifier receives clock signals of a first clock of the plurality of corrected clocks, and a second differential amplifier receives clock signals of a second clock of the plurality of the corrected clocks.

9. The system of claim 8, wherein the first and second differential amplifiers are controlled by the at least one DAC.

10. The system of claim 9, wherein each of the plurality of clock mixers mixes the received first and second clocks based on the bias current provided to the first and second differential amplifiers.

11. The system of claim 1, wherein (i) the plurality of corrected clocks are common-mode line (CML) signals and (ii) each of the further corrected clocks is a complementary metal-oxide-semiconductor (CMOS) signal.

12. A system to correct phase skews for a plurality of phase-interpolated clocks, the system comprising:
   a phase interpolator, wherein the phase interpolator is configured to generate the plurality of phase-interpolated clocks; and
   a plurality of clock mixers, wherein the plurality of clock mixers is configured to (i) receive the plurality of phase-interpolated clocks and (ii) generate a plurality of corrected clocks based on the received plurality of phase-interpolated clocks,
   wherein the plurality of corrected clocks includes an in-phase (I) clock, an ~I clock, a quadrature (Q) clock, and a ~Q clock, wherein the ~I clock is opposite in polarity to the I clock and the ~Q clock is opposite in polarity to the Q clock, wherein a corrected Q clock is 90° out of phase with a corrected I clock,
   wherein: the plurality of clock mixers comprises (i) a first clock mixer that receives a phase-interpolated I clock and a phase-interpolated Q clock, and generates the corrected I clock, (ii) a second clock mixer that receives the phase-interpolated Q clock and a phase-interpolated ~I clock, and generates the corrected Q clock, (iii) a third clock mixer that receives the phase-interpolated ~I clock and a phase-interpolated ~Q clock, and generates a corrected ~I clock, and (iv) a fourth clock mixer that receives the phase-interpolated ~Q clock and the phase-interpolated I clock, and generates a corrected ~Q clock.

13. The system of claim 12, wherein of the plurality of clock mixers includes a plurality of differential amplifiers and at least one analog-to-digital controller (DAC), wherein a first differential amplifier receives clock signals of a first clock of the plurality of phase-interpolated clocks and a second differential amplifier receives clock signals of a second clock of the plurality of the phase-interpolated clocks, wherein the first and second differential amplifiers are controlled by the at least one DAC.

14. The system of claim 13, wherein of the plurality of clock mixers mixes the received first and second clocks based on bias currents provided to the first and second differential amplifiers by the at least one DAC.

15. A method to correct phase skews for a plurality of phase-interpolated clocks, the method comprising:
   generating, with a phase interpolator, the plurality of phase-interpolated clocks;
   receiving, with a ring oscillator, at least one in-phase (I) clock and at least one ~I clock of the plurality of phase-interpolated clocks, wherein the at least one ~I clock is opposite in polarity to the at least one I clock;
   generating, with the ring oscillator, a plurality of corrected clocks based on the received at least one I clock and at least one ~I clock, wherein the plurality of corrected clocks includes (i) corrected I and ~I clocks and (ii) at least one quadrature (Q) clock and ~Q clock, wherein the I clock and the Q clock have a static phase relationship;
   receiving, with a plurality of clock mixers, the plurality of corrected clocks; and generating, with the plurality of clock mixers, a plurality of further corrected clocks based on the received corrected clocks, wherein the plurality of clock mixers comprises (i) a first clock mixer that receives the corrected I clock and the Q clock, and generates a further corrected I clock, (ii) a second clock mixer that receives the Q clock and the corrected ~I clock, and generates a corrected Q clock, (iii) a third clock mixer that receives the corrected ~I clock and the ~Q clock, and generates a further corrected ~I clock, and (iv) a fourth clock mixer that receives the ~Q clock and the corrected I clock, and generates a corrected ~Q clock.

* * * * *